United States Patent

Jinbo

[11] Patent Number: 5,966,043
[45] Date of Patent: Oct. 12, 1999

[54] POWER SUPPLY SWITCHING CIRCUIT

[75] Inventor: Toshikatsu Jinbo, Tokyo, Japan

[73] Assignee: NEC Corporation, Tokyo, Japan

[21] Appl. No.: 08/825,574

[22] Filed: Mar. 31, 1997

[30] Foreign Application Priority Data

Mar. 29, 1996 [JP] Japan .................................... 8-103849

[51] Int. Cl.$^6$ .................................................. H03K 3/01
[52] U.S. Cl. .......................... 327/530; 327/434; 327/534; 365/226
[58] Field of Search ..................................... 327/403, 404, 327/389, 390, 434, 530, 534, 537; 365/189.1, 226

[56] References Cited

U.S. PATENT DOCUMENTS

| 4,893,275 | 1/1990 | Tanaka et al. | 365/226 |
|---|---|---|---|
| 5,179,297 | 1/1993 | Hsueh et al. | 327/530 |
| 5,260,643 | 11/1993 | Sandhu | 365/226 |
| 5,592,430 | 1/1997 | Ohtsuki | 365/226 |
| 5,663,917 | 9/1997 | Oka et al. | 365/226 |

FOREIGN PATENT DOCUMENTS

5-174592  7/1993  Japan .

*Primary Examiner*—Jung Ho Kim
*Attorney, Agent, or Firm*—Whitham, Curtis & Whitham

[57] ABSTRACT

A power supply switching circuit comprises first and second PMOSFETs connected in series between a writing high voltage and an output terminal in the named order, and third and fourth PMOSFETs connected in series between a reading voltage and the output terminal in the named order. A substrate potential of the first PMOSFET is connected to the writing high voltage, and a substrate potential of the third PMOSFET is connected to the reading voltage. A substrate potential of the second and fourth PMOSFETs are connected in common to a substrate potential control circuit which is configured to selectively supply either the writing high voltage or the reading voltage to the common connected sub~t rate potential of the second and fourth PMOSFETs.

8 Claims, 7 Drawing Sheets

POWER SUPPLY SWITCHING CIRCUIT

BACKGROUND OF THE INVENTION

1. Field of the Invention

The present invention relates to a semiconductor device, and more specifically to power supply switching circuit.

2. Description of Related Art

A semiconductor memory includes the type in which a memory cell is constituted of an electrically writable and erasable floating gate field effect transistor.

Figure 1:
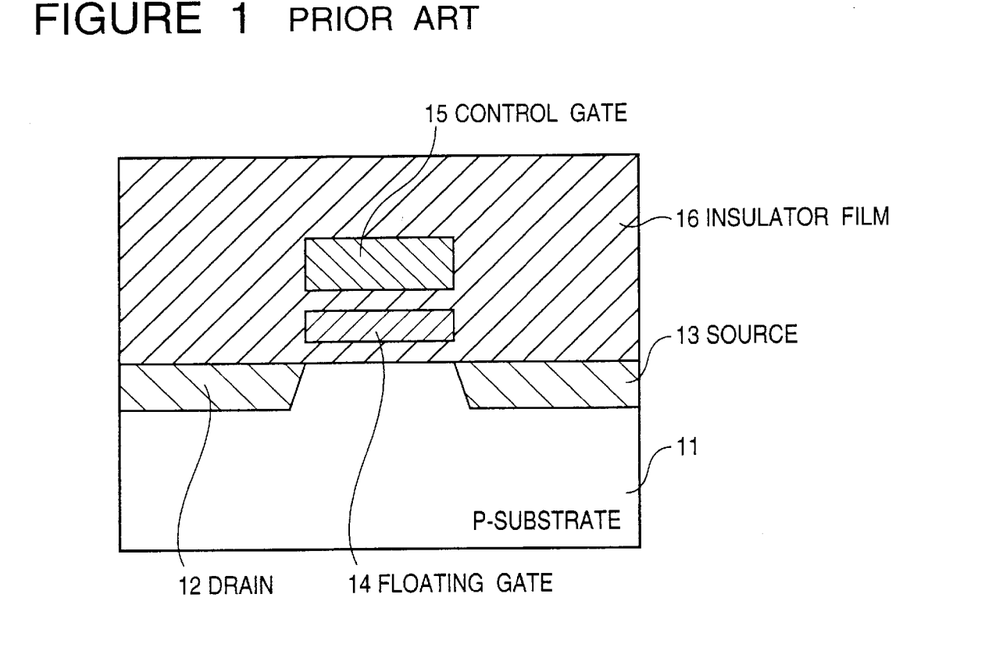
FIG. 1 is a diagrammatic sectional view of the memory cell constituted of the electrically writable and erasable floating gate field effect transistor.

Referring to FIG. 1, there is shown a diagrammatic sectional view of this type memory cell. As shown in FIG. 1, the memory cell includes a P-type semiconductor substrate 11 and a drain diffused region 12 and a source diffused region 13 formed separately from each other by selectively ion implanting arsenic into a principal surface of the substrate. Furthermore, a floating gate 14 and a control gate 15 are stacked through an insulator film on the principal surface of the substrate between the drain region 12 and the source the region 13. An insulating film 16 is formed to cover the whole of the memory cell.

In the case of writing information into this memory cell, a high voltage on the order of 12V is applied to the gate electrode 15, and a high voltage of the order of 6 V is applied to the drain 12, and the source 13 is grounded so that electrons are injected to the floating gate by action of a hot carrier injection, with the result that a threshold voltage viewed from the floating gate 15 is made high.

Figure 2:
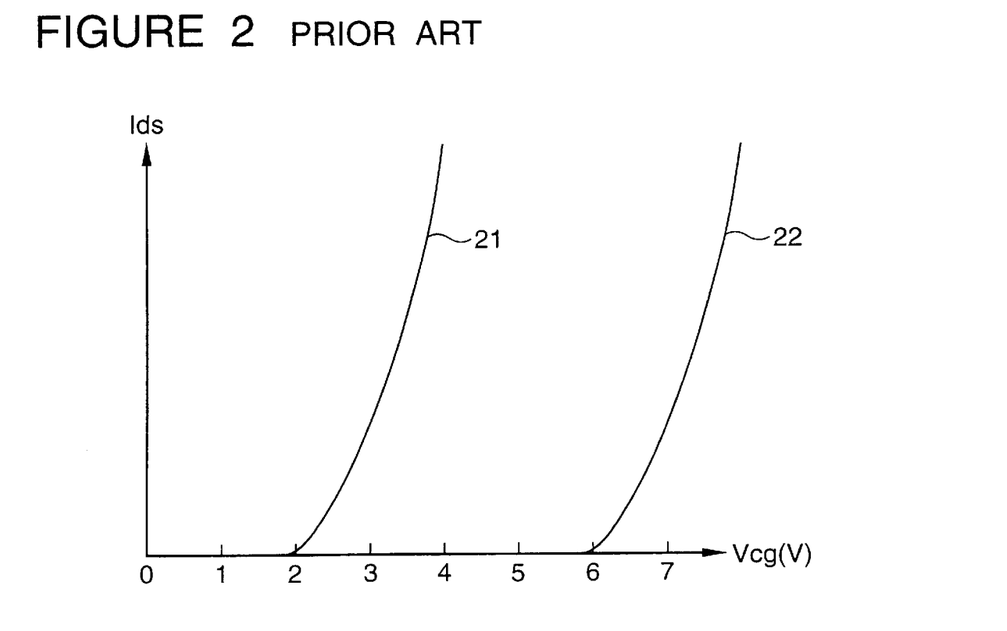
FIG. 2 is a graph illustrating a gate voltage—source current characteristics in the non-written condition and in the written condition of the memory cell constituted of the floating gate field effect transistor.

FIG. 2 is a graph illustrating an initial condition (non-written condition) and the written condition of this type memory cell. In the non-written condition, the memory cell becomes conductive by applying a control gate voltage Vcg on the order of 2 V, as shown by the curved line 21. On the other hand, in the non-written condition, the memory cell becomes conductive by applying a control gate voltage Vcg on the order of 6 V, as shown by the curved line 22.

Accordingly, if the control gate voltage is set to 5 V, the memory cell in the non-written condition is brought into a conductive condition, but the memory in the written condition is maintained in a non-conductive condition. Information is memorized by a difference of the current between the conductive condition and the non-conductive condition.

In the above mentioned semiconductor memory, in the case of reading the information, the semiconductor memory is operated with a power supply voltage of 5 V, and in the case of writing the information, it is necessary to selectively supply the memory cell gate with the high voltage of for example 12 V, which is supplied from an external circuit of the semiconductor memory, or is generated by a step-up circuit internally provided in the semiconductor memory. Therefore, a power supply switch circuit is required which selectively switch between the power supply voltage of 5 V at the information reading time and the high voltage of 12 V at the information writing time.

Figure 3:
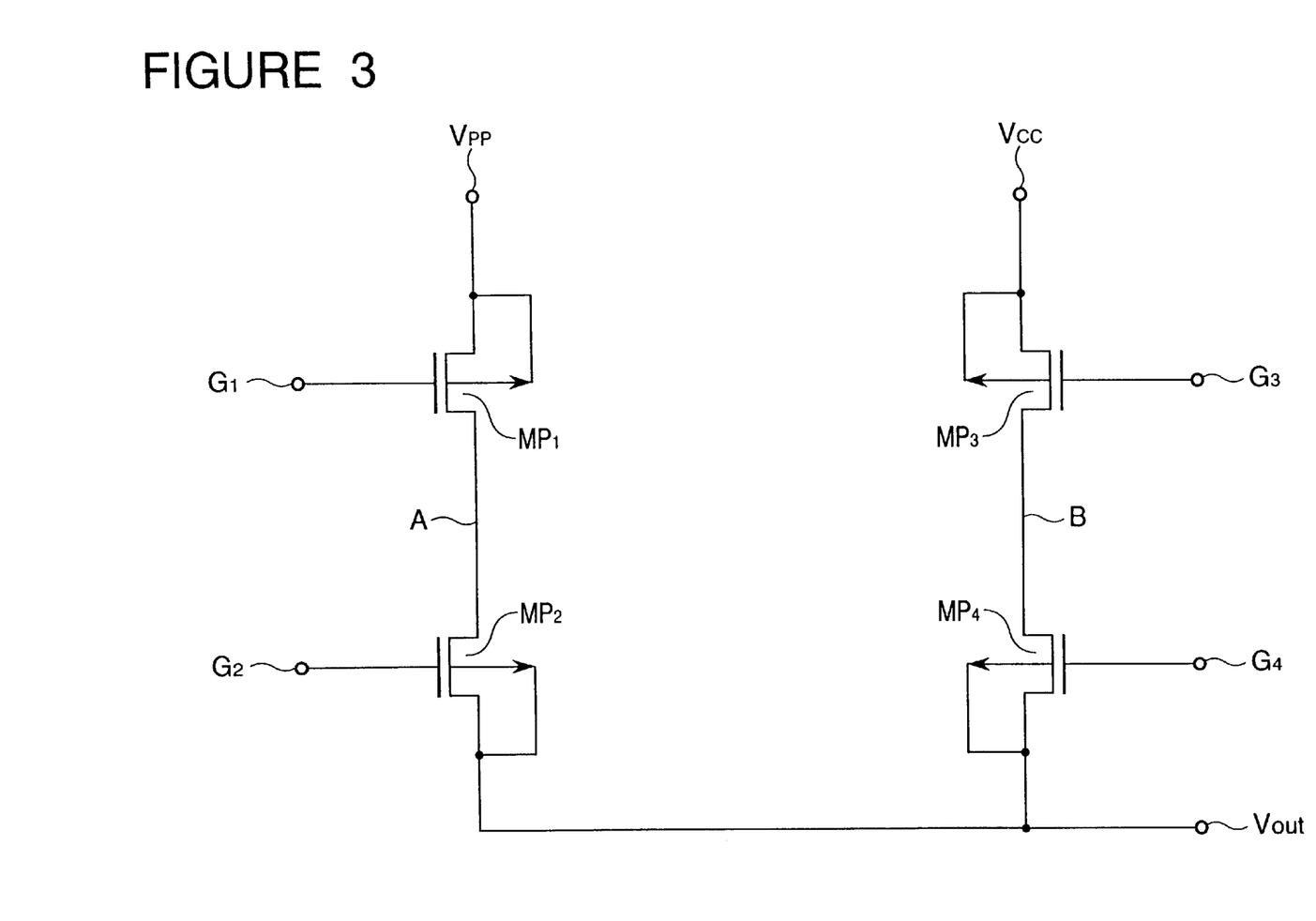
FIG. 3 is a circuit diagram of one example of the prior art power supply switching circuit.

Referring to FIG. 3, there is shown a circuit diagram of one example of a prior art power supply switching circuit. In addition, the following TABLE 1 shows a DC voltage on various nodes in the circuit shown in FIG. 3.

TABLE 1

| $G_1$ | $G_2$ | $G_3$ | $G_4$ | $V_{out}$ |
|---|---|---|---|---|
| $V_{pp}$ (12 V) | $V_{cc}$ (5 V) | 0 V | 0 V | $V_{cc}$ (5 V) |
| 0 V | 0 V | $V_{cc}$ (5 V) | $V_{pp}$ (12 V) | $V_{pp}$ (12 V) |

As shown in FIG. 3, the prior art power supply switching circuit includes a pair of P-channel metal oxide semiconductor field effect transistors (each simply called "PMOSFET" hereinafter) MP1 and MP2 are connected in series between a writing high voltage Vpp and an output terminal Vout. A substrate potential of the PMOSFET MPI is connected to the writing high voltage Vpp, and a substrate potential of the PMOSFET M2 is connected to the output terminal Vout. The prior art power supply switching circuit also includes another pair of PMOSFETs MP3 and MP4 are connected in series between a reading voltage Vcc and the output terminal Vout. A substrate potential of the PMOSFET MP3 is connected to the reading voltage Vcc, and a substrate potential of the PMOSFET MP4 is connected to the output terminal Vout.

Now, a DC operation of the shown prior art power supply switching circuit will be described with reference to the TABLE 1, assuming that 2 V is supplied as the writing high voltage Vpp and 5 V is supplied as the reading voltage Vcc.

In the case of outputting 5 V from the output terminal Vout, 0 V is applied to gate terminals G3 and G4 of the PMOSFETs MP3 and MP4, so as to render these PMOSFETs MP3 and MP4 conductive, so that the reading voltage Vcc is transferred throlgh the PMOSFETs MP3 and MP4 to the output terminal Vout. As a result, a voltage of the output terminal Vout becomes 5 V.

At this time, 12 V is applied to a gate G1 of the PMOSFET MP1 and 5 V is applied to a gate G2 of the PMOSFET MP2, so that the PMOSFETs MP1 and MP2 are brought into a non-conductive condition. Therefore, the writing high voltage Vpp is completely isolated from the output terminal Vout.

On the other hand, in the case of outputting 12 V from the output terminal Vout 0 V is applied to the gate terminals G1 and G2 of the PMOSFETs MP1 and MP2, so as to render these PMOSFETs MP1 and MP2 conductive, so that the writing high voltage Vpp is transferred through the PMOSFETs MPI and MP2 to the output terminal Vout. As a result, a voltage of the output terminal Vout becomes 12V.

At this time, 5 V is applied to the gate G3 of the PMOSFET MP3 and 12 V is applied to the gate G4 of the PMOSFET MP2, so that the PMOSFETs MP3 and MP4 are brought into a non-conductive condition. Therefore, the reading voltage Vcc is completely isolated from the output terminal Vout.

Thus, in the prior art power supply switching circuit as mentioned above, either the writing high voltage Vpp or the reading voltage Vcc is alternatively outputted, and there is no unnecessary DC current leakage. This is attributable to provision of the PMOSFETs MP2 and MP4.

Namely. when 12V is outputted from the output terminal Vout, since the gate terminal G4 of the PMOSFET MP4 is brought to 12V, the PMOSFET MP4 is brought into the non-conductive condition, so that the voltage of the utput terminal Vout is never applied to a connection node between the PMOSFETs MP3 and MP4.

Here, if it is assumed that the voltage of 12V is applied to the connection node B, a PN junction between a P-type diffusion layer of the PMOSFET MP3 at the side of the connection node B, and the substrate potential of the PMOSFET MP3 applied with 5 V, is biased in a forward direction, so that a leakage current occurs.

On the other hand, it is considered that when 5 V is outputted from the output terminal Vout, the writing high voltage Vpp is brought to OV, because, in an ordinary reading operation, 0 V is applied to a terminal of the writing high voltage Vpp from an external circuit of the semiconductor memory.

In this case, by applying 5 V to the gate G2 of the PMOSFET MP2, the PMOSFET MP2 is brought into the non-conductive condition, the voltage of the output terminal Vout is not applied to a connection node A between the PMOSFETs MPI and MP2.

Here, if t is assumed that the voltage of 5 V is applied to the connection node A, a PN junction between a P-type diffusion layer of the PMOSFET MP1 at the side of the connection node A, and the substrate potential of the PMOSFET MP1 applied with OV, is biased in a forward direction, so that a leakage current occurs.

Now, an AC operation of the shown prior art power supply switching circut will be described with reference to FIG. 4, which is a waveform diagram illustrating a change in voltage on various nodes in the circuit shown FIG. 3.

First, consider that the output voltage Vout is caused to change from 5V to 12 V. At a timing T1, the gate voltage G1 of the PMOSFET MP1 is caused to change from 12V to OV, and the gate voltage G2 of the PMOSFET MP2 is caused to change from 5V to OV, so that the PMOSFETs MP1 and MP2 are rendered conductive. On the other hand, the gate voltage G3 of the PMOSFET MP3 is caused to change from 0 V to 5 V, and the gate voltage G4 of the PMOSFET MP4 is caused to change from 0 V to 5 V, so that the PMOSFETs MP3 and MP4 are rendered non-conductive. Thus, the output terminal Vout is charged through the PMOSFETs MP1 and MP2, and reaches 12V at a timing T2.

In the above mentioned process of charging the output terminal Vout from 5 V to 12 V, since the P-type diffused layer of the PMOSFET MPt at the side of the writing high voltage Vpp and the substrate potential of the PMOSFET MP1 are 12 V, the voltage is supplied from the writing high voltage Vpp to the connection node A in an ordinary MOSFET operating condition. On the other hand, since the P-type diffused layer of the PMOSFET MP2 at the side of the connection node A is 12 V, and since the P-type diffused layer of the PMOSFET MP1 at the side of the output terminal Vout and the substrate potential of the PMOSFET MP2 are 5 V, a PN junction between the P-type diffused layer of the PMOSFET MP 2 at the side of the connection node A and the substrate potential of the PMOSFET MP 2 is biased in a forward direction.

An Operation condition of this MOSFET MP2 will be described with reference to FIG. 5, which is a diagrammatic section view of the PMOSFET MP2 formed in a P-type semiconductor substrate 1.

Figure 5:
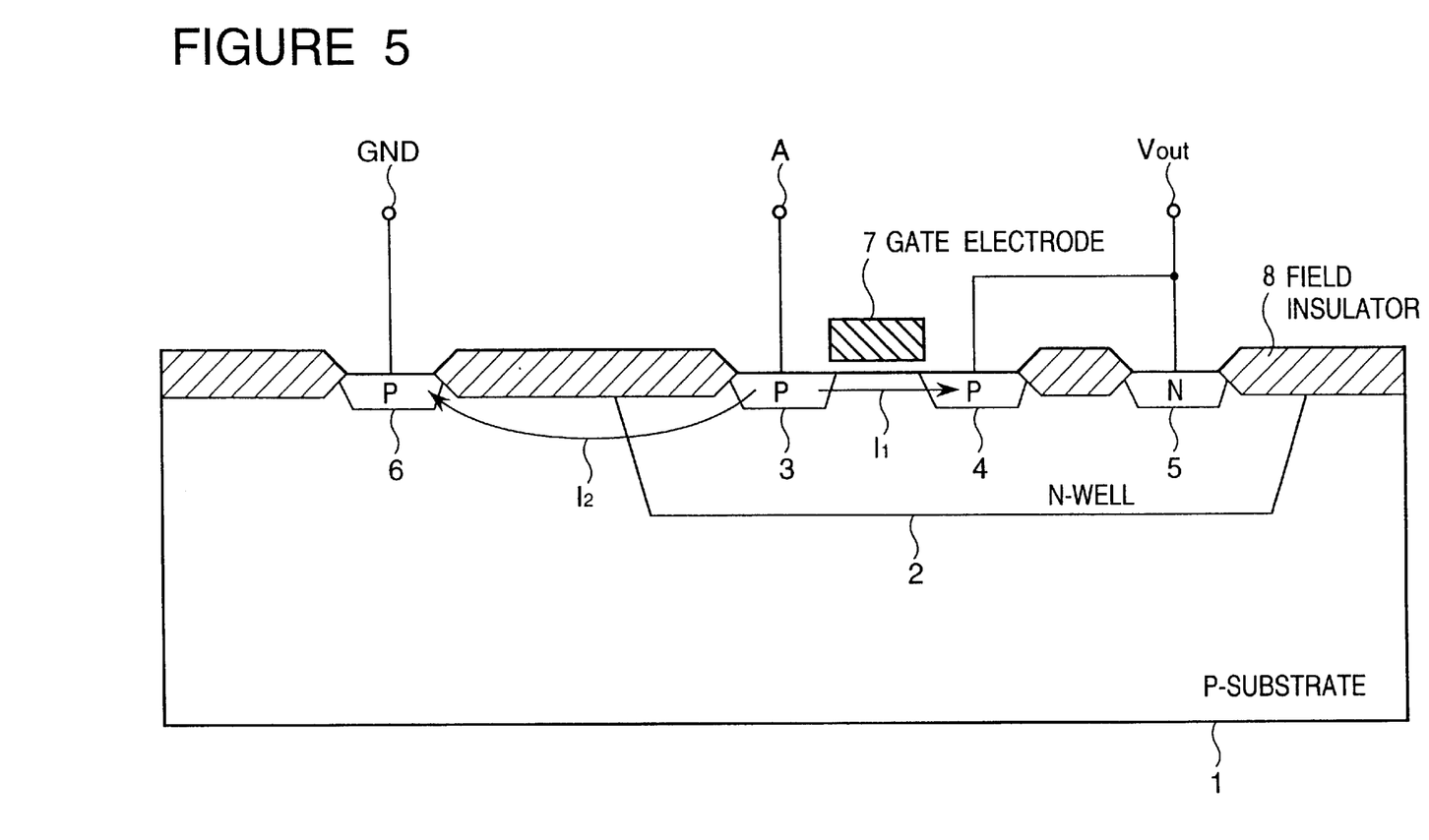
FIG. 5 is a diagrammatic section view of the P-channel MOSFET formed in a P-type semiconductor substrate.

As shown in FIG. 5, an N-type well 2 is formed in the P-type semiconductor substrate 1, and the PMOSFET MP2 is constituted of a pair of P-type diffused layers 3 and 4 formed in the N-type well 2 and a gate electrode 7 located through a gate insulator (not shown) on a channel region defined between the pair of P-type diffused layers 3 and 4. Furthermore, an N-type diffused layer 5 is formed in the N-type well 2 for supplying a biasing voltage for the N-type well 2. As seen from comparison between FIGS. 3 and 5, the P-type diffused layer 3 is connected to the connection node A, and the P-type diffused layer 4 and the N-type diffused layer 5 is connected to the output terminal Vout.

A P-type diffused layer 6 is formed for supplying a ground potential GND to the P-type semiconductor substrate 1, and is connected to the ground potential GND.

In the structure shown in FIG. 5, if the N-type well 2 and the P-type diffusect layer 4 are brought to 5 V, and the P-type diffused layer 3 is brought to 12 V, a PN junction between the P-type diffused layer 3 and the N-type well 2 is biased in a forward direction, so that holes are injected from lie P-type diffused layer 3 to the N-type well 2. The holes, which have been injected into the N-type well 2 and which are minority carriers in the N-type well 2, reach the P-type diffused layer 4 by passing through a path I1, so that the holes are supplied to the output terminal Vout. As a result, the potential of the output terminal Vout elevates.

This means that a PNP junction constituted of the P-type diffused layer 3, the N ype well 2 and the P-type diffused layer 4, operates as a bipolar transistor. Thereafter, if the potential of the N-type well 2 elevates and the injection of the holes terminates, the PMOSFET MP2 operates as an ordinary MOSFET.

Furthermore, when the holes are injected from the P-type diffused layer 3, a PNJ junction constituted of the P-type diffused layer 3, the N-type well 2 and the P-type semiconductor substrate 1, also operates as a bipolar transistor. The holes are injected into the P-type semiconductor substrate 1, by passing through a path 12, and the holes injected into the P-type semiconductor substrate I are taken out through the P-type diffused layer 6.

On the other than, when the output terminal Vout is caused to change from 2 V to 5 V, an electric charge is discharged from the output terminal Vout through the PMOSFETs MP3 and MP4 to the reading voltage Vcc, so that the output voltage Vout is brought to 5 V. In this process, the P-type diffused layer of the PMOSFET MP3 at the side of the connection node B is biased in a forward direction, the PMOSFET MP3 operates is a bipolar transistor, similarly to the PMOSFET MP2 mentioned just above.

Incidentally, in order to shorten the period that the PMOSFET MP3 operates as the bipolar transistor, there is provided a means (not shown in FIG. 3) composed of an N-channel metal oxide semiconductor field effect transistor (simply called "NMOSFET" hereinafter) which is connected between the output terminal Vout and the ground GND and which is turned on for a predetermined period at an initial stage of the process of changing the output voltage Vout from 12V to 5 V, so that the charge of the output terminal Vout is further discharged.

Figure 4:
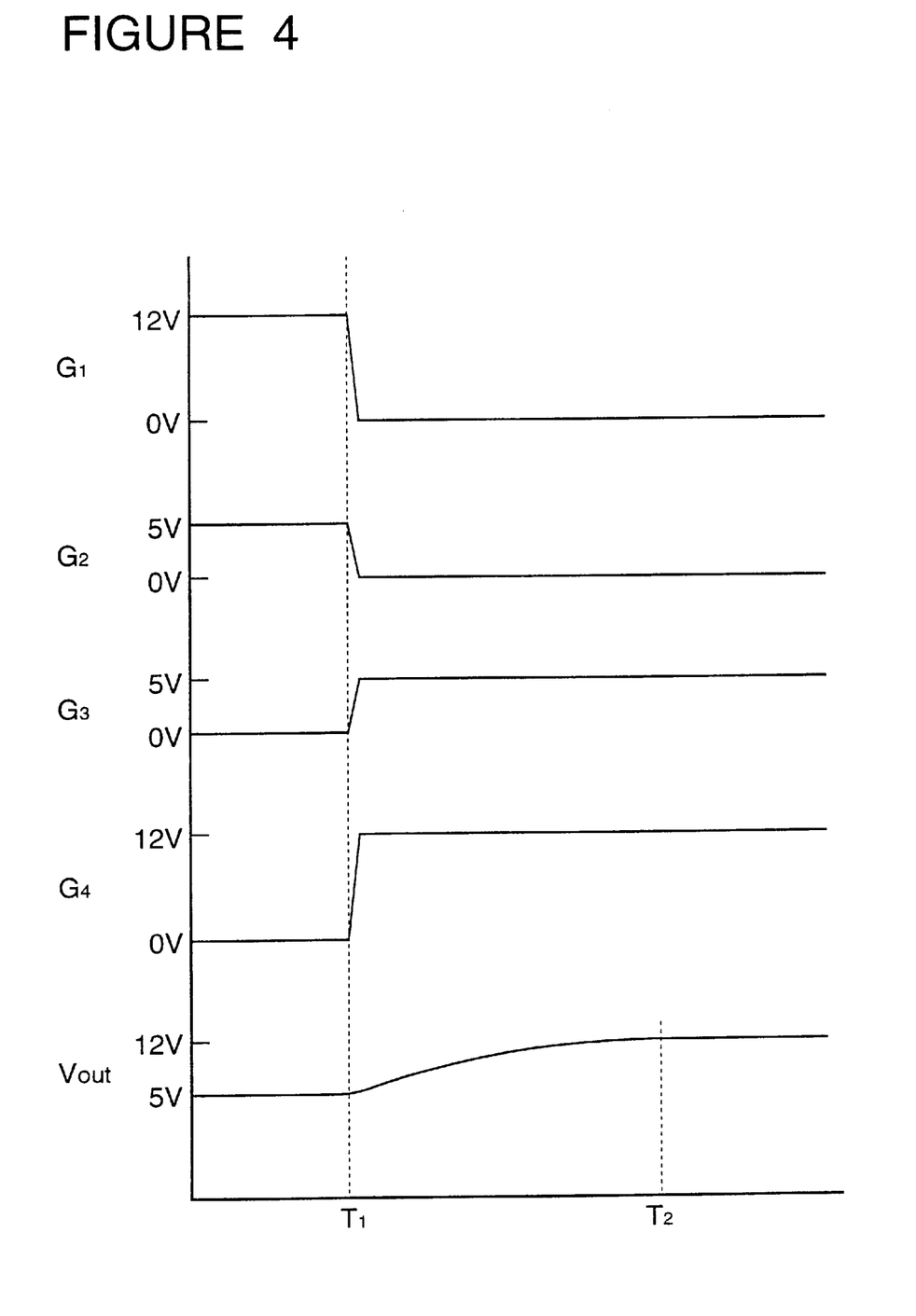
FIG. 4 is a waveform diagram illustrating a change in voltage on various nodes the circuit shown in FIG. 3.

As mentioned above, in the prior art power supply switching circuit as mentioned above, when the output voltage Vout is switched from 5 V to 12 V, in the period from TI to T2 in the timing chart of FIG. 4, the PMOSFET MP 2 operates as the bipolar transistor to charge the output terminal Vout. At this time, since the holes are simultaneously charged into the P-type semiconductor substrate, an unnecessary current flows from the writing high voltage Vpp, with the result that a consumed electric current inevitably increases.

This also means that when a load capacitance of the output voltage Vout is large, the period from TI to T2 in the timing chart of FIG. 4 becomes long. This is a serious problem.

Furthermore, there is dangerous possibility that the holes injected into the substrate causes a latch-up. Accordingly, this restricts a location of circuit elements in the neighborhood of the power supply switching circuit.

Other than the period of switching the output voltage Vout from 5 V to 12V, in a period of constantly outputting the output voltage Vout at 12 V or 5 V when a consumed current of a load circuit connected to the output Vout is large, since the output voltage Vout, namely, the substrate potential of the PMOSFETs MP2 and MP4 lower, the P-type diffused layer of the PMOSFET MP2 at the side of the connection node A in the case of outputting 5 V, and the P-type diffused layer of the PMOSPET MP4 at the side of the connection node B in the case of outputting 12 V, are biased in the forward direction with the result that holes are injected into the P-type semiconductor substrate. Accordingly, the consumed current increases, and there occurs dangerous possibility that the holes injected into the substrate causes a latch-up.

SUMMARY OF THE INVENTION

Accordingly, it is an object of the present invention to provide a power supply switching circuit which has overcome the above mentioned defects of the conventional one.

An other object of the present invention is to provide a power supply switching circuit having a reduced consumed current and a less dangerous possibility of causing the latch-up.

The above and other objects of the present invention are achieved in accordance with the present invention by a power supply switching circuit comprising:

first and second MOSFETs of a first channel type connected in series between a first power supply voltage and an output terminal;

third and fourth MOSFETs of the first channel type connected in series between a second power supply voltage and the output terminal;

a substrate potential of the first MOSFET connected to the first power supply voltage being connected to the first power supply voltage, a substrate potential of the third MOSFET connected to the second power supply voltage being connected to the second power supply voltage, a substrate potential of the second and fourth MOSFETs connected to the output terminal being connected in common, and a substrate potential control means for selectively supplying either the first power supply voltage or the second power supply voltage to the common connected substrate potential of the second and fourth MOSFETs.

In a preferred embodiment of the power supply switching circuit, the substrate potential control means includes:

a fifth MOSFET of the first channel type connected between a connection node between the first and second MOSFETs and the common connected substrate potential of the second and fourth MOSFETs; and a sixth MOSFET of the first channel type connected between a connection node between the third and fourth MOSFETs and the common connected substrate potential of the second and fourth MOSFETs, a substrate potential of the fifth and sixth MOSFETs being connected in cornmon to the common connected substrate potential of the second and fourth MOSFETs.

In another preferred embodiment of the power supply switching circuit, the substrate potential control means includes:

fifth and sixth MOSFETs of the first channel type connected in series between the first power supply voltage and the common connected substrate potenial of the second and fourth MOSFETs; and seventh and eighth MOSFETs of the first channel type connected in series between the second power supply voltage and the common connected substrate potential of the second and fourth MOSFETs, a substrate potential of the fifth MOSFET connected to the first power supply voltage being connected to the first power supply voltage, a substrate potential of the seventh MOSFET connected to the second power supply voltage being connected to the second power supply voltage, a substrate potential of the sixth and eighth MOSFETs which are connected to the second and fourth MOSFETs, respectively, being connected in common to the common connected substrate potential of the second and fourth MOSFETs.

The above and other objects, features and advantages of the present invention will be apparent from the following description of preferred embodiments of the invention with reference to the accompanying drawings.

DESCRIPTION OF HE PREFERRED EMBODIMENTS

Figure 6:
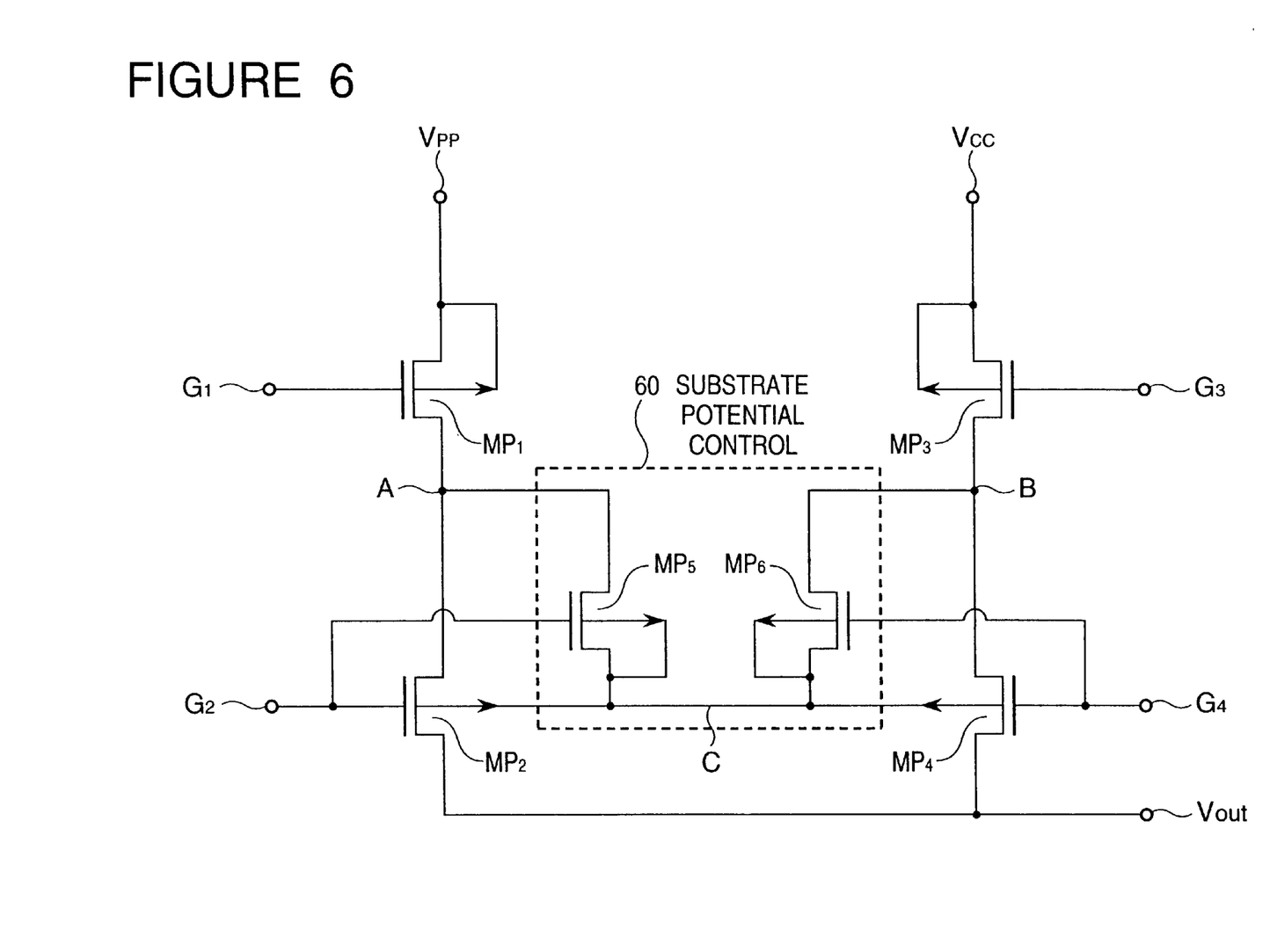
FIG. 6 is a circuit diagram of a first embodiment of the power supply switching circuit in accordance with the present invention.

Referring to FIG. 6, there is shown a circuit diagram of a first embodiment of the power supply switching circuit in accordance with the present invention. In FIG. 6, elements corresponding to those shown in FIG. 3 are given the same Reference Numerals and Signs.

The shown first embodiment includes P-channel MOSFETs MPi and MP2 connected in series between a writing high voltage Vpp and an output terminal Vout, and a substrate potential of the PMOSFET MP1 connected to the writing high voltage Vpp is connected to the writing high voltage Vpp. The shown first embodiment also includes P-channel MOSFETs MP 3 and MP4 connected in series between a reading high voltage Vcc and the output terminal Vout, and a substrate potential of the PMOSFET MP 3 connected to the reading high voltage Vcc is connected to the reading high voltage Vcc. Substrate potentials of the PMOSFET MP2 and the PMOSFET MP4 are connected in common to a connection node C, which is controlled by a substrate potential control circuit 60.

The substrate potential control circuit 60 includes a P-channel MOSFET MP 5 connected between a connection node A between PMOSFETs MP1 and MP2 and the connection node C, a substrate potential of the PMOSFET MP5 being connected to the connection node C, and a gate of the PMOSFET MP5 being connected to a gate G2 of PMOSFET MP 2, and a P-channel MOSFET MP6 connected between a connection node B between the PMOSFETs MP3 and MP4 and the connection node C, a substrate potential of the PMOSFET MP6 being connected to the connection node C, and a gate of the PMOSFET MP6 being connected to a gate G4 of PMOSFET MP4.

Now, a DC operation of the shown embodiment will be described with reference to the TABLE 2:

TABLE 2

| $G_1$ | $G_2$ | $G_3$ | $G_4$ | C | Vout |
|---|---|---|---|---|---|
| $V_{pp}$ (12 V) | $V_{cc}$ (5 V) | 0 V | 0 V | $V_{cc}$ (5 V) | $V_{cc}$ (5 V) |
| 0 V | 0 V | $V_{cc}$ (5 V) | $V_{pp}$ (12 V) | $V_{pp}$ (12 V) | $V_{pp}$ (12 V) |

In a connection that 12 V is supplied as the writing high voltage Vpp and 5 V is supplied as the reading voltage Vcc, in the case of outputting 5 V from the (output terminal Vout, 0 V is applied to gate terminals G3 and 04 of the PMOSFETs MP3, MP4 and MP6, so as to render these PMOSFETs MP3, MP4 and MP6 conductive, so that the reading voltage Vcc is transferred through the PMOSFETs MP3 and MP4 to the output terminal Vout. As a result, a voltage of the output terminal Vout becomes 5V.

On the other hand, 12 V is applied to a gate G1 of the PMOSFET MP1 and 5 V applied to the gate terminal G2 of the PMOSFETs MP2 and MP5, so that the PMOSFETs MP1, MP2 and MP5 are brought into a non-conductive condition. Therefore, the writing high voltage Vpp is completely isolated from the output terminal Vout.

At this time, the connection node C, which is the substrate potential of the PMOSFETs MP1 and MP4, is supplied with the reading voltage Vcc through the PMOSFET MP3 and the PMOSFET MP6 in the substrate potential control circuit 60.

In the case of outputting 12 V from the output terminal Vout, 0 V is applied to the gate terminals G1 and G2 of the PMOSFETs MP1, MP2 and MP5, so as to render these PMOSFETs MP1, MP2 and MP5 conductive, so that the writing high voltage Vpp is transferred through the PMOSFET MP1 and MP2 to the output terminal Vout. As a result, a voltage of the input terminal Vout becomes 12V.

On the other hand, 5 V is applied to the gate G3 of the PMOSFET MP3 and 12 V is applied to the gate terininal G4 of the PMOSFETs MP2 and MP6, so that the PMOSFETs MP3, MP4 and MP6 are brought into a non-conductive condition. Therefore, the reading voltage Vcc is completely isolated from the output terminal Vout.

At this time, the connection node C, which is the substrate potential of the PMOSFETs MP2 and MP4, is supplied with the writing high voltage Vpp through the PMOSFET MP1 and the PMOSFET MP5 in the substrate potential control circuit 60.

As seen from the above, the shown embodiment realizes the same DC operation is that of the prior art power supply switching circuit shown in FIG. 3.

Figure 7:
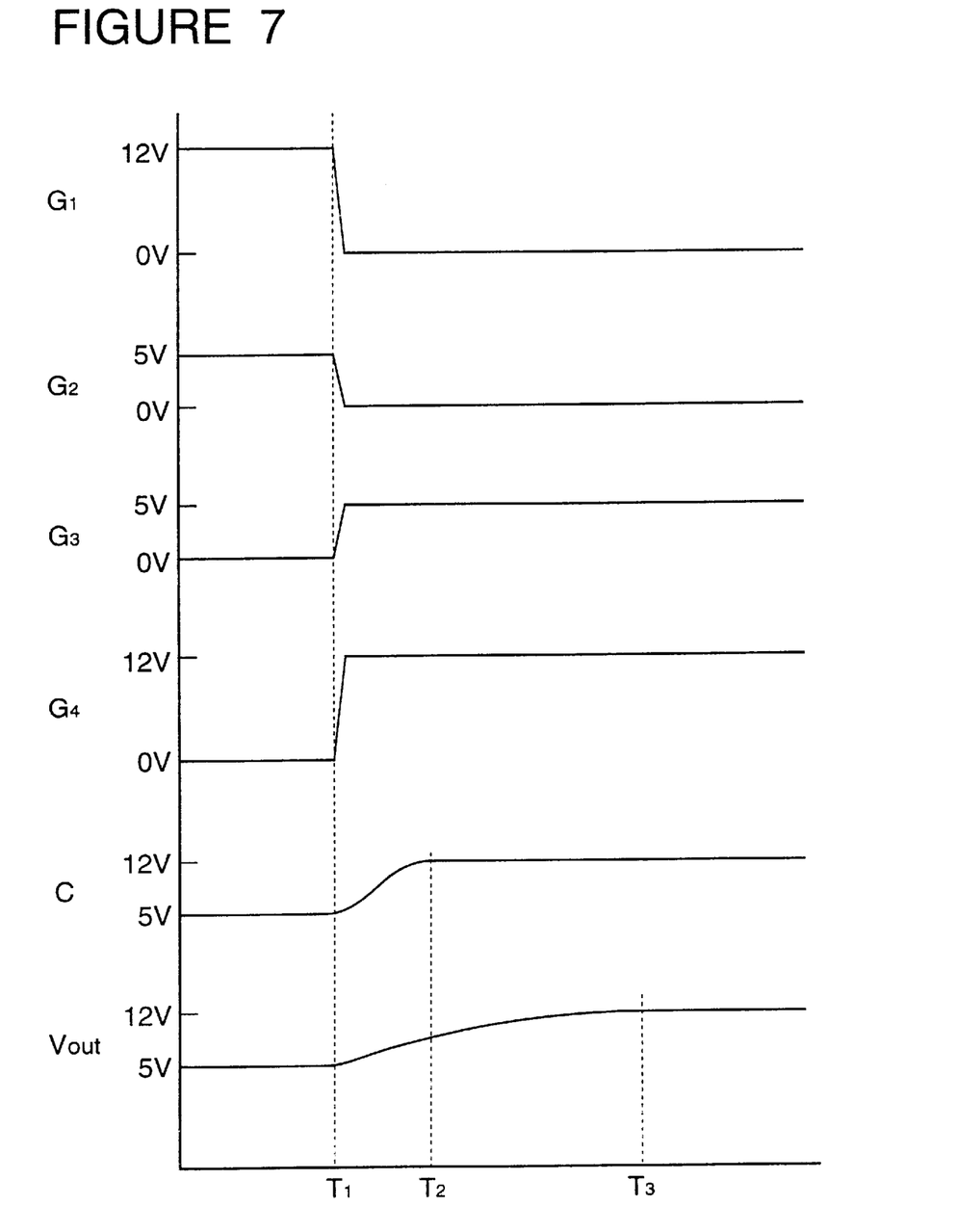
FIG. 7 is a waveform diagram illustrating a change in voltage on various nodes in the circuit shown in FIG. 6.

Now, an AC operation of the shown embodiment will be described with reference to FIG. 7, which is a waveform diagram illustrating a change in voltage on various nodes in the circuit shown in FIG. 6.

First, consider that the output voltage Vout is caused to change from 5 V to 12 V. At a timing T1, the gate voltage GI of the PMOSFET MP1 is caused 0 change from 12 V to 0 V, and the gate voltage G2 of the PMOSFETs MP2 and MP5 is caused to change from 5 V to 0 V, so that the PMOSFETs MP1, MP2 and MP5 are rendered conductive. On the other hand, the gate voltage G3 of the PMOSFET MP3 is caused to change from 0 V to 5 and the gate voltage G4 of the PMOSFETs MP4 and MP6 is caused to change from OV to 12V, so that the PMOSFETs MP3, MP4 and MP6 are rendered non-conductive. Thus, it starts to charge the output terminal Vout through the PMOSFETs MP1 and MP2. At the same time, it starts to charge the connection node C through the PMOSFETs MP1 and MP5.

Here, a load capacitance of the connection node C is mainly constituted of substrate capacitance of the PMOSFETs MP2, MP4, MP5 and MP6, namely, a junction capacitance between the P-type semiconductor substrate and the N-type wells in which these PMOSFETs MP2, MP4, MP5 and MP6 are formed, respectively. In ordinary cases, accordingly, the capacitance value of the connection node C is sufficiently smaller than a load capacitance of the output terminal Vout. Therefore, the charging of the connection node C is completed earlier than the charging of the output terminal Vout.

In a period from the timing T1 to a timing T2, since a connection node A between the PMOSFETs MP1 and MP2 is at 12V but the connection node C (which is the substrate potential of the PMOSFETs MP2 and MP5 is at a voltage lower than 12 V. Therefore, similarly to the prior art example mentioned hereinbefore, the P-type diffused layer of the PMOSFETs MP2 and MP5 at the side of the connection node A is biased in a forward direction.

However after the connection node C has been charged to 12 V at the timing T2, the P-type diffused layer of the PMOSFETs MP2 and MP5 at the side of the connection node A are no longer biased in a forward direction, with the result that the PMOSFET MP 2 operates in an ordinary MOSFET operating condition for charging the output terminal Vout.

In the prior art example shown in FIG. 3, until the output terminal Vout reaches 12 V, the P-type diffused layer of the PMOSFET MP2 at the side of the connection node A is biased in a forward direction so as to inject the holes into the P-type semiconductor substrate. In the shown embodiment, differently from the prior art example, during the period from T to T3, namely, during the period after the completion of the charging of the connection node C until the completion of the charging of to output terminal Vout, the P-type diffused layer of the PMOSFETs MP2 and MP5 at the side of the connection node A are no longer biased in a forward direction, with the result that an unnecessary current is never consumed.

In addition, since the substrate potential of the PMOSFETs MP2 and MP4 are supplied from the substrate potential control circuit 60, even if the potential of the output terminal Vout lowers because of a large consumed current of a load circuit connected to the output terminal Vout, the substrate potential of the PMOSFETs MP2 and MP4 do not change, and therefore, the P-type diffused layer of the PMOSFETs MP2 and MP5 at the side of the connection node A are never biased in a forward direction.

In the above mentioned description, a conduction resistance of the PMOSFET MP 1 has been ignored for simplification of description.

Furthermore, in an actual circuit operation, the potential of the connection node A lowers because of a conduction resistance of the PMOSFETs MP1 and MP2 and a current flowing through the PMOSFETs MP1 and MP2. However, a relation in voltage between the P-type diffused layer and the substrate potential of the PMOSFET MP2 is the same as the above description ignoring the voltage drop of the connection node A. Therefore, an operation advantage similar to the above mentioned embodiment can be obtained in an actual circuit.

An operation of charging the output terminal Vout from 12V to 5 V, is the same as that of the prior art example mentioned hereinbefore, and therefore explanation will be omitted for simplification of description.

Figure 8:
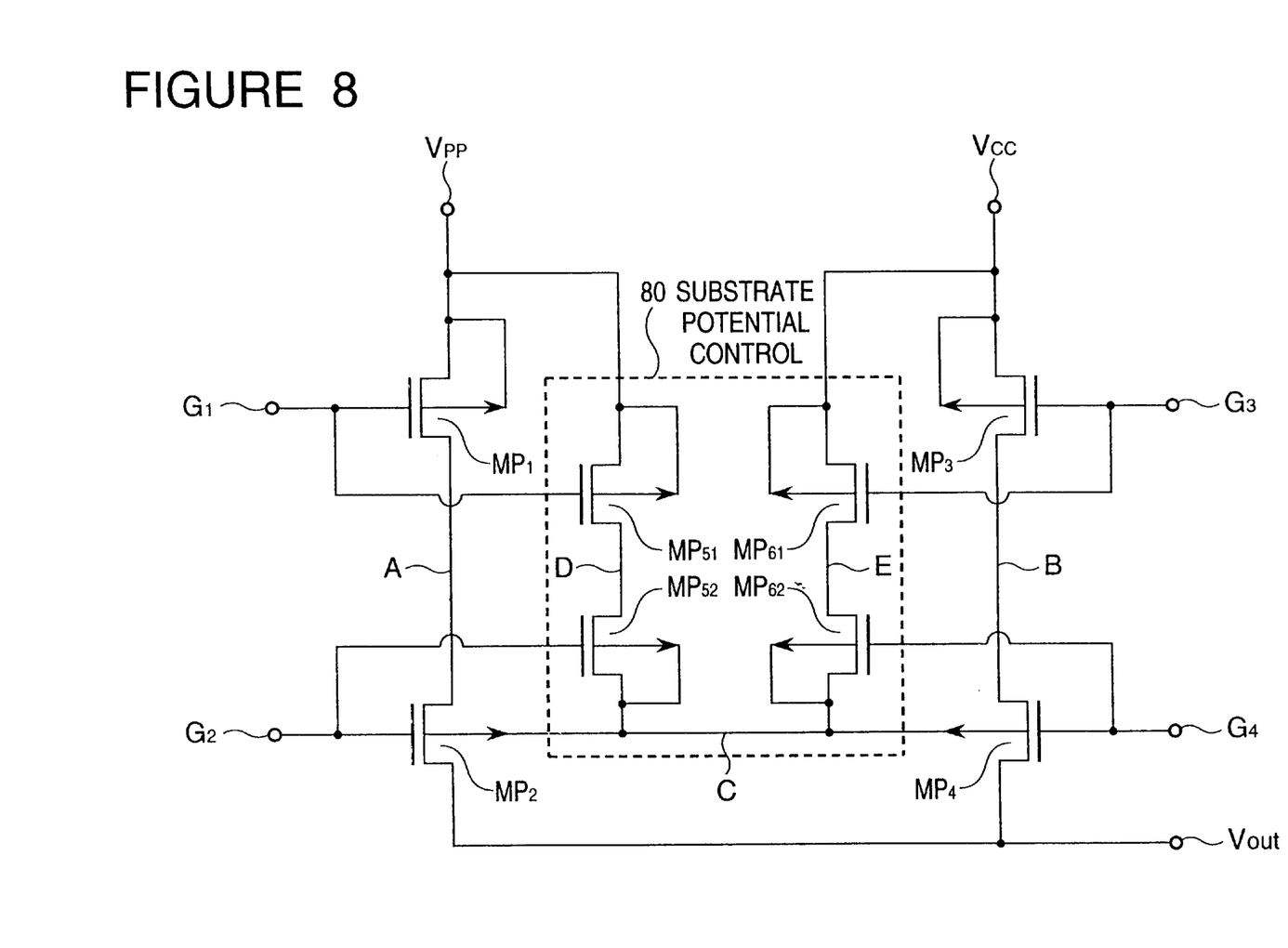
FIG. 8 is a circuit diagram of a second embodiment of the power supply switching circuit in accordance with the present invention.

Now, a second embodiment of the power supply switching circuit in accordance with the present invention will be described with reference to FIG. 8. In FIG. 8, elements corresponding to those shown in FIG. 6 are given the same Reference Numerals and Signs, and explanation thereof will omitted.

As seen from comparison between FIGS. 6 and 8, the second embodiment includes a substrate potential control circuit 80 in place of the substrate potential control circuit 60 of the first embodiment.

The substrate potential control circuit 80 includes a pair of PMOSFETs MP51 and MP52 connected in series between the writing high voltage Vpp and the connection node C, a substrate potential of the PMOSPET MP51 being connected to the writing high voltage Vpp, and a gate of the PMOSFET Mp51 being connected to the gate terminal G1 of the PMOSFET MP1, and a gate of the PMOSFET MP52 being connected to the gate terminal G2 of the PMOSFET MP2, and another pair of PMOSFETs MP61 and MP62 connected in series between the reading voltage Vcc and the connection node C, a substrate potential of the PMOSFET MP61 being connected to the reading voltage Vcc, and a gate of the PMOSFET MP61 being connected to the gate terminal G3 of the PMOSFET MP 3, and a gate of the PMOSFET MP62 being connected to the gate terminal G4 of the PMOSFET MP4, a substrate potential of both the PMOSFET MP52 arid MP62 being connected to the connected node C.

Comparing the second embodiment with the first embodiment, the first embodiment is so configured that the PMOSFETs MP1 and MP3 constituting the current path for charging the output terminal Vout also functions as a current path for charging the substrate potential of the PMOSFETs Mp 2 and MP4. In the second embodiment, on the other hand, since the PMOSFET MP 51 is located in parallel to the PMOSFET MP 1 and the PMOSF ET MP61 is located in parallel to the PMOSFET MP3, the current path for charging the output terminal Vout is completely separated from the current path for charging the substrate potential of the PMOSFETs MP2 and MP4.

The second embodiment operates similarly to the first embodiment and can exert (an operational advantage similar to that obtained in the first embodiment. Furthermore, the second embodiment has the following additional advantage.

In the first embodiment shown in FIG. 6, in the condition of continuing to supply 12V to the output terminal Vout, when the potential of the output terminal Vout lowers because a consumed current of a circuit connected to the output terminal Vout$_1$ a current flows from the writing high voltage Vpp through the PMOSFETs MP1 and MP2 to the output terminal Vout, with the result that the potential of the connection node A lowers by a voltage drop determined by the conduction resistance of the PMOSFETs MP1 and MP2 and the current flowing therethrough, and therefore, this lowered voltage on the connection node A is supplied to the substrate potential of the PMOSFET MP2.

If the voltage drop on the connection node A is remarkable, the P-type diffused layer of the PMOSFET MP2 at the side of the connection node A is biased in a forward direction until the connection node C is charged again to 12V through the PMOSFET MP5.

In the second embodiment shown in FIG. 8, on the other hand, since the connection node C is charged by either the writing high voltage Vpp or the reading voltage Vcc by the current path independently of the current path for charging the output terminal Vout. Therefore, the potential of the connection node C is not subjected to influence of the voltage variation of the output terminal Vout.

The invention has thus been shown and described with reference to the specific embodiments. However, it should be noted that the present invention is in no way limited to the details of the illustrated structures but changes and modifications may be made within the scope of the appended clams.

For example, the above description has explained about the switching between the writing high voltage Vpp and the reading voltage Vcc, but the present invention is not limited to only this switching. The present invention can be applied to a switching between a plurality of different voltages, which are supplied from a circuit external to the semiconductoi device or are generated in an internal circuit of the semiconductor device.

Furthermore, if a plurality of power supply switching circuits each constructed in accordance with the present invention are provided in parallel to one another, it is possiblee to switch between more than two different voltages.

As seen from the above, the power supply switching circuit in accordance with the present invention is characterized by comprising first and second MOSFETs of a first channel type connected in series between a first power supply voltage and an output terminal, third and fourth MOSFETs of the first channel type connected in series between a second power supply voltage and the output terminal, a substrate potential of the first MOSFET connected to the first power supply voltage being connected to the first power supply voltage, a substrate potential of the third MOSFET connected to the second power supply voltage being connected to the second power supply voltage, a substrate potential of the second and fourth MOSFETs connected to the output terminal being connected in common, and a substrate potential control means for selectively supplying either the first power supply voltage or the second power supply voltage to the common connected substrate potential of the second and fourth MOSFETs.

With the above mentioned arrangement, in the process of switching the voltage of the output terminal from a low voltage to a high voltage, it is possible to shorten the period that the diffused layer of the MOSFET is in a forward direction biased condition, thereby to prevent the increase of the consumed current and also to minimize the amount of holes injected into the semiconductor substrate, with the result that a dangerous possibility of generation of the latch-up can be minimized.

I claim:

1. A power supply switching circuit, comprising:

first and second MOSFETs of a first channel type connected in series between a first power supply voltage and an output terminal;

third and fourth MOSFETs of said first channel type connected in series between a second power supply voltage and said output terminal, wherein either said first power supply voltage or said second power supply voltage is supplied from said output terminal by controlling a voltage applied to a gate of said first and second MOSFETs and a voltage applied to a gate of said third and fourth MOSFETs;

said second and fourth MOSFETs connected to said output terminal and having respective substrates connected to one another at a connection node, so that substrate potentials of said second and fourth MOSFETs are common; and means for changing said substrate potential of said second MOSFET from said second power supply voltage to said first power supply voltage, in a process of switching an output voltage of said output terminal from said second power supply voltage to said first power supply voltage, wherein said substrate potential changing means includes:

a fifth MOSFET of said first channel type connected between a connection node between said first and second MOSFETS and said connection node connecting the substrates of said second and fourth MOSFETs; and a sixth MOSFET of said first channel type connected between a connection node between said third and fourth MOSFETs and said connection node connecting the substrates of said second and fourth MOSFETs, said fifth and sixth MOSFETs having respective substrates connected in common to said connection node connecting the substrates of said second and fourth MOSFETs, so that substrate potentials of said fifth and sixth MOSFETs and the substrate potentials of said second and fourth MOSFETs are common.

2. A power supply switching circuit comprising:

first and second MOSFETs of a first channel type connected in series between a first power supply voltage and an output terminal;

third and fourth MOSFETs of said first channel type connected in series between a second power supply voltage and said output terminal;

so that either said first power supply voltage or said second power supply voltage is supplied from said output terminal by controlling a voltage applied to a gate of said first and second MOSFETs and a voltage applied to a gate of said third and fourth MOSFETs, said second and fourth MOSFETs connected to said output terminal and having respective substrates connected to one another at a connection node, so that substrate potentials of said second and fourth MOSFETs are common, and means for changing said substrate potential of said second MOSFET from said second power supply voltage to said first power supply voltage, in a process of switching an output voltage of said output terminal from second power supply voltage to said first power supply voltage, wherein said substrate potential changing means includes:

fifth and sixth MOSFETs of said first channel type connected in series between said first power supply voltage and said connection node connecting said second and fourth MOSFETs; and seventh and eighth MOSFETs of said first channel type connected in series between said second power supply voltage and said common node connecting said second and fourth MOSFETs, a substrate potential of said fifth MOSFET being connected to said first power supply voltage, a substrate potential of said seventh MOSFET being connected to said second power supply voltage, said sixth and eighth MOSFETs connected to said second and fourth MOSFETs, respectively, so that substrate potentials of said sixth and eighth MOSFETs are common with said substrate potentials of said second and fourth MOSFETs, respectively.

3. A power supply switching circuit claimed in claim 1 wherein said first and second power supply voltages are supplied from power supplies external to a semiconductor device, and are different from each other.

4. A power supply switching circuit claimed in claim 1 wherein said first and second power supply voltages are generated in an internal circuit of a semiconductor device, and are different from each other.

5. A power supply switching circuit, comprising:

first and second MOSFETs of a first channel type connected in series between a first power supply voltage and an output terminal;

third and fourth MOSFETs of said first channel type connected in series between a second power supply voltage and said output terminal;

a substrate potential of said first MOSFET connected to said first power supply voltage;

a substrate potential of said third MOSFET connected to said second power supply voltage, said second and fourth MOSFETs connected to said output terminal and having respective substrates connected to one another at a connection node, so that substrate potentials of said second and fourth MOSFETs are common; and a substrate potential changing means for selectively supplying either said first power supply voltage or said second power supply voltage to the common connected substrate potentials of said second and fourth MOSFETs, wherein said substrate potential changing means includes:

a fifth MOSFET of said first channel type connected between a connection node between said first and second MOSFETs and said connection node connecting the substrates of said second and fourth MOSFETs; and a sixth MOSFET of said first channel type connected between a connection node between said third and fourth MOSFETs and said connection node connecting the substrates of said second and fourth MOSFETs, substrate potentials of said fifth and sixth MOSFETs being common with said substrate potentials of said second and fourth MOSFETs.

6. A power supply switching circuit comprising:

first and second MOSFETs of a first channel type connected in series between a first power supply voltage and an output terminal;

third and fourth MOSFETs of said first channel type connected in series between a second power supply voltage and said output terminal;

a substrate potential of said first MOSFET being connected to said first power supply voltage, a substrate potential of said third MOSFET being connected to said second power supply voltage, said second and fourth MOSFETs connected to said output terminal and having respective substrates connected to one another at a connection node, so that substrate potentials of said second and fourth MOSFETs are common, and a substrate potential changing means for selectively supplying either said first power supply voltage or said second power supply voltage to the common connected substrate potentials of said second and fourth MOSFETs, wherein said substrate potential changing means includes:

fifth and sixth MOSFETs of said first channel type connected in series between said first power supply voltage and said connection node connecting said second and fourth MOSFETs; and seventh and eighth MOSFETs of said first channel type connected in series between said second power supply voltage and said connection node connecting said second and fourth MOSFETs, a substrate potential of said fifth MOSFET being connected to said first power supply voltage, a substrate potential of said seventh MOSFET being connected to said second power supply voltage, said sixth and eighth MOSFETs connected to said second and fourth MOSFETs, respectively, so that substrate potentials of said sixth and eighth MOSFETs are common with said substrate potentials of said second and fourth MOSFETs, respectively.

7. A power supply switching circuit claimed in claim 5 wherein said first and second power supply voltages are supplied from power supplies external to a semiconductor device, and are different from each other.

8. A power supply switching circuit claimed in claim 5 wherein said first and second power supply voltages are generated in an internal circuit of a semiconductor device, and are different from each other.

* * * * *